(12) United States Patent
Yamaguchi et al.

(10) Patent No.: US 10,651,060 B2
(45) Date of Patent: May 12, 2020

(54) SUBSTRATE TREATING METHOD AND SUBSTRATE TREATING DEVICE

(71) Applicant: SCREEN Holdings Co., Ltd., Kyoto (JP)

(72) Inventors: Yuji Yamaguchi, Kyoto (JP); Masahiro Kimura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 210 days.

(21) Appl. No.: 15/710,205

(22) Filed: Sep. 20, 2017

(65) Prior Publication Data

US 2018/0090343 A1 Mar. 29, 2018

(30) Foreign Application Priority Data

Sep. 26, 2016 (JP) .................. 2016-186666

(51) Int. Cl.
*H01L 21/67* (2006.01)
*H01L 21/677* (2006.01)

(52) U.S. Cl.
CPC .. *H01L 21/67057* (2013.01); *H01L 21/67028* (2013.01); *H01L 21/67034* (2013.01); *H01L 21/67063* (2013.01); *H01L 21/67161* (2013.01); *H01L 21/67207* (2013.01); *H01L 21/67739* (2013.01)

(58) Field of Classification Search
CPC ......... H01L 21/67028; H01L 21/67034; H01L 21/67057; H01L 21/67063; H01L 21/67161; H01L 21/67207; H01L 21/67739

USPC ....................................................... 134/95.2
See application file for complete search history.

(56) References Cited

U.S. PATENT DOCUMENTS

| 2002/0036005 A1 | 3/2002 | Kimura ........................ 134/30 |
| 2009/0001046 A1 | 1/2009 | Kubota et al. ................ 216/13 |
| 2016/0089696 A1 | 3/2016 | Kimura |

FOREIGN PATENT DOCUMENTS

| JP | 2002-110621 A | 4/2002 |
| JP | 2008-160011 A | 7/2008 |
| JP | 2009-010043 A | 1/2009 |
| JP | 2009-021420 A | 1/2009 |
| JP | 2011-071172 A | 4/2011 |
| JP | 2013-157625 A | 8/2013 |
| JP | 2016-072446 A | 5/2016 |
| KR | 10-2008-0061239 A | 7/2008 |
| KR | 10-2016-0038725 A | 4/2016 |
| TW | 201115670 A1 | 5/2011 |
| TW | I392046 B1 | 4/2013 |

*Primary Examiner* — Levon J Shahinian
(74) *Attorney, Agent, or Firm* — Ostrolenk Faber LLP

(57) ABSTRACT

A substrate treating method dries a substrate on a surface of which a predetermined pattern is formed. The substrate treating method includes: a washing step of washing the substrate by immersing the substrate into a washing liquid after the washing liquid is stored into the treating tank in a sealed chamber; a decompression step of decompressing an inside of the chamber; a lifting step of lifting the substrate from the washing liquid stored in the treating tank; a liquid discharge step of discharging the washing liquid from the treating tank; and a hydrophobing step of replacing an atmosphere in the chamber with a hydrophobic agent and performing a hydrophobing treatment on the surface of the substrate.

16 Claims, 8 Drawing Sheets

SUBSTRATE TREATING METHOD AND SUBSTRATE TREATING DEVICE

CROSS-REFERENCE TO RELATED APPLICATION

This application is based upon and claims the benefit of priority of the prior Japanese Patent Application No. 2016-186666, filed on Sep. 26, 2016 the entire contents of which are incorporated herein by reference.

BACKGROUND

The present invention relates to a substrate treating method and a substrate treating device for performing a predetermined treatment on a substrate of a semiconductor wafer and a relevant item.

A manufacturing process of a semiconductor device includes a step of performing an etching treatment and a washing treatment on a substrate of a semiconductor wafer and a relevant item, by immersing the substrate into a treating tank, and a step of performing a drying treatment of removing a treating liquid from the surface of the substrate. Such steps are performed by a substrate treating device that has a plurality of treating tanks.

In the drying treatment, there has been an occurrence of collapse of a pattern formed on the substrate surface. The collapse of a pattern is assumed to occur due to imbalance in the surface tension because of non-uniform remaining of a washing liquid in the pattern formed on the substrate.

Conventionally, there has been proposed a technique for shortening the time required for replacement of the gas in the chamber, by replacing the gas with a supplied nitrogen gas and by discharging the gas with an exhaust pump (for example, JP 2009-21420 A). Further, there has been proposed a substrate treating device and a substrate treating method for preventing collapse of a fine pattern, by reducing the surface tension of pure water (for example, JP 2011-71172 A). Further, in order to shorten the drying time, there has also been proposed a technique for drying a substrate by causing evaporation of a hydrophobic agent that adheres to the substrate after a hydrophobing process is performed (for example, JP 2013-157625 A). Further, there has also been proposed a technique for performing a water repellent treatment, by immersing a substrate, of which surface is replaced with an organic solvent, into a water repellent agent stored in a treating tank (for example, JP 2016-72446 A).

SUMMARY

Conventionally, there has been proposed a technique for suppressing collapse of a pattern by reducing the surface tension generated in the course of drying the substrate surface, by performing a hydrophobing treatment on the surface of the substrate. However, in the batch treatment of treating a plurality of substrates, there has been a problem in that a consumption quantity of a hydrophobic agent increases when a hydrophobing treatment is performed by immersing the plurality of substrates into the hydrophobic agent.

Therefore, an object of the present invention is to reduce a use quantity of a hydrophobic agent in the case of performing a hydrophobing treatment in a substrate drying treatment.

In order to solve the above problem, the present invention has the following configuration.

The present invention provides a substrate treating method for drying a substrate on a surface of which a predetermined pattern is formed, the substrate treating method including: a washing step of washing the substrate by immersing the substrate into a washing liquid after the washing liquid is stored into the treating tank in a sealed chamber; a decompression step of decompressing an inside of the chamber; a lifting step of lifting the substrate from the washing liquid stored in the treating tank; a liquid discharge step of discharging the washing liquid from the treating tank; and a hydrophobing step of replacing an atmosphere in the chamber with a hydrophobic agent and performing a hydrophobing treatment on the surface of the substrate.

By decompressing the inside of the chamber, the hydrophobic agent can be vaporized easily. Then, in the hydrophobing step, a hydrophobing treatment can be performed on the substrate surface by exposing the substrate to the atmosphere of the hydrophobic agent. By performing the hydrophobing treatment in the atmosphere of the hydrophobic agent, a use quantity of the hydrophobic agent can be substantially reduced as compared with a case where the substrate is immersed into a liquid of the hydrophobic agent, for example. That is, when the hydrophobing treatment is performed in the substrate drying treatment, the use quantity of the hydrophobic agent can be reduced.

The substrate treating method may further include a first organic-solvent-atmosphere forming step of replacing the atmosphere in the chamber with an organic solvent after the washing step and before the decompression step. When moisture on the substrate surface is directly replaced with a hydrophobic agent, the hydrophobic agent may be deactivated and foreign matters may be generated. These problems can be solved by first replacing the moisture on the substrate surface with an organic solvent, and thereafter by replacing the organic solvent with a hydrophobic agent.

The substrate treating method may further include a second organic-solvent-atmosphere forming step of replacing the atmosphere in the chamber with an organic solvent after the hydrophobing step. When the hydrophobic agent is dried from the substrate surface, foreign matters may be generated and collapse of a pattern formed on the surface may occur. These problems can be solved by replacing the hydrophobic agent on the substrate surface again with the organic solvent, and thereafter by drying the organic solvent.

The second organic-solvent-atmosphere forming step may be performed while the treatment of decompressing the inside of the chamber which is started in the decompression step is continued. When the decompression of the chamber is stopped, due to a rise in a partial pressure of the organic solvent, the organic solvent may adhere, as condensation and droplet, to an inside of the chamber other than the substrate surface. As a result, the hydrophobic agent on the substrate surface cannot be replaced with the organic solvent, and the pattern on the surface may be collapsed at a drying stage. These problems can be solved by continuing the decompression of the inside of the chamber.

Further, the second organic-solvent-atmosphere forming step may be performed after the decompression of the inside of the chamber which is started in the decompression step is stopped. With this arrangement, vapor of the organic solvent can be easily condensed on the substrate surface, and the efficiency of replacing the hydrophobic agent on the substrate surface with the organic solvent can be improved.

Further, in the hydrophobing step, at least a part of the hydrophobic agent may be supplied as liquid to the treating tank. Because the pressure of the inside of the chamber is lowered by the decompression step, vaporization of the hydrophobic agent in the chamber can be promoted. In order to supply the hydrophobic agent in vapor, there is a case of increasing the temperature of the hydrophobic agent to higher than the normal temperature. However, when the temperature is increased too much, the substrate surface is dried in the course of replacing the hydrophobic agent with an organic solvent so that the pattern on the surface may be collapsed. By vaporizing the hydrophobic agent in the chamber, supplying the hydrophobic agent at an excessively high temperature can be avoided.

Further, the substrate treating method may further have a liquid reservoir capable of storing a liquid in the chamber. In the hydrophobing step, at least a part of the hydrophobic agent may be supplied in liquid to the liquid reservoir. Further, the hydrophobic agent functions by mixing a first agent and a second agent. In the hydrophobing step, the first agent may be supplied to the treating tank and the second agent may be supplied to the liquid reservoir. For example, for the first agent and the second agent, agents that function as a hydrophobic agent and an activator are used. In this case, although the effect of hydrophobing is enhanced in a predetermined time after the mixing the agents, thereafter, the effect is lowered. Therefore, it is not desirable to mix the two agents in advance. With the above arrangement, the first agent and the second agent can be mixed at a suitable timing in the chamber.

Further, the chamber has a shielding member that partitions a space inside the chamber. The liquid reservoir may be provided on a same side as the substrate after the substrate is lifted higher than the shielding member in the lifting step. With this configuration, agents and the like stored in the liquid reservoir can be efficiently vaporized around the substrate.

There may be provided a substrate treating device that dries a substrate on a surface of which a predetermined pattern is formed. Specifically, the substrate treating device may include: a sealed chamber; a treating tank provided in the chamber and capable of washing the substrate by storing a washing liquid; a decompressing unit that decompresses an inside of the chamber; a lifting unit that lifts the substrate from the washing liquid in the treating tank; a liquid discharge unit that discharges the washing liquid from the treating tank; and a hydrophobing unit that replaces an atmosphere in the chamber with a hydrophobic agent after the liquid discharge unit discharges the washing liquid.

The decompressing unit that decompresses the inside of the chamber can easily vaporize the hydrophobic agent by decompressing the inside of the chamber. The hydrophobing unit can perform the hydrophobing treatment on the substrate surface by exposing the substrate to the atmosphere of the hydrophobic agent. By performing the hydrophobing treatment in the atmosphere of the hydrophobic agent, a use quantity of the hydrophobic agent can be substantially reduced as compared with a case where the substrate is immersed into a liquid of the hydrophobic agent, for example. That is, when the hydrophobing treatment is performed in the substrate drying treatment, the use quantity of the hydrophobic agent can be reduced.

Means for solving the above problem can be used by appropriately combining together.

According to the present invention, by removing the hydrophobic agent from the substrate before the drying treatment, foreign matters that remain after the drying can be reduced.

DETAILED DESCRIPTION

Embodiments of the present invention will be described in detail below with reference to the drawings. The embodiments described below represent one mode of the invention of the present application, and does not limit the technical range of the invention of the present application.

First Embodiment (Configuration)

Figure 1:
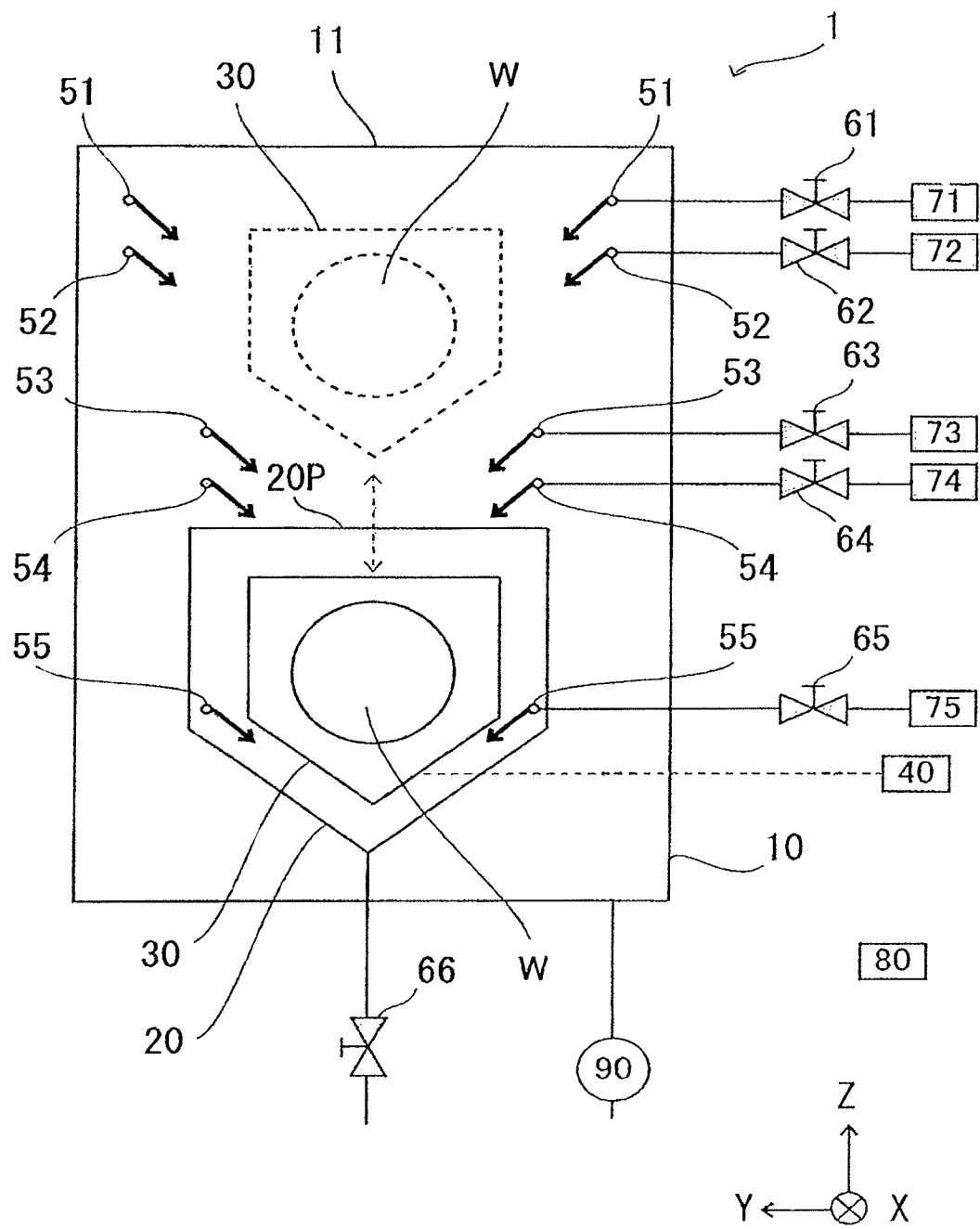
FIG. 1 is a sectional view of the inside of a substrate treating device when viewed from the front.

FIG. 1 is a schematic sectional view of the inside of a substrate treating device 1 according to the embodiment when viewed from the front. The substrate treating device 1 configures a part of a batch system that performs an etching treatment, a washing treatment, and a drying treatment on a plurality of substrates (for example, semiconductor substrates) W, and mainly corresponds to a unit that performs the drying treatment.

The substrate treating device 1 is a device that supplies IPA (isopropyl alcohol), as an organic solvent, to a substrate for which a rinse (washing) treatment by using pure water has ended, and dries the organic solvent. The substrate treating device 1 includes a chamber 10, a treating tank 20, a holding mechanism 30, a lifting mechanism (corresponding to the "lifting unit" according to the present invention) 40, nozzles 51 to 55, valves 61 to 65 for respectively opening and closing the nozzles 51 to 55, an inert gas supply source 71 that supplies an inert gas such as a nitrogen (N2) gas to the nozzle 51, an IPA supply source 72 that supplies IPA vapor (vapor) to the nozzle 52, an IPA supply source 73 that supplies IPA vapor to the nozzle 53, a hydrophobic agent supply source 74 that supplies a hydrophobic agent to the nozzle 54, a treating-liquid supply source 75 that supplies a rinse liquid such as pure water to the treating-liquid supply nozzle 55, a control unit 80, and an exhaust pump (corresponding to the "decompressing unit" according to the present invention) 90.

The chamber 10 is a casing that accommodates inside the treating tank 20, the lifting mechanism 40, and the nozzles 51 to 55. A chamber cover (also referred to as a "lid part") 11 provided on the upper part of the chamber 10 is openable and closable. In the state that the chamber cover 11 of the chamber 10 is opened (also referred to as an "opened lid"), the substrate W can be carried in and out from the open portion. On the other hand, in the state that the chamber cover 11 of the chamber 10 is closed (also referred to as a "closed lid"), the inside of the chamber 10 can be sealed.

The treating tank 20 is a tank configured to store a chemical liquid such as hydrofluoric acid or a rinse liquid such as pure water (these liquids are also collectively referred to as a "treating liquid") and in which a surface treatment is performed on the substrate. The treating tank 20 is accommodated inside the chamber 10. The nozzle 55 is disposed near the bottom part of the treating tank 20. The treating liquid can be supplied into the treating tank 20 from the treating-liquid supply source 75 via the nozzle 55. The treating liquid is supplied from the bottom part of the treating tank 20, and overflows from an opening part 20P of the treating tank 20. In the treating tank 20, by opening a liquid discharge valve (corresponding to the "liquid discharge unit" according to the present invention) 66, the treating liquid stored in the treating tank 20 can be also discharged to a liquid discharge line (not shown).

The holding mechanism 30 holds a plurality of substrates W separated from each other in a depth direction (a direction X in FIG. 1) in the state that the main surface (a circuit formation surface) of each substrate W is vertical. The lifting mechanism 40 can lift the holding mechanism 30 in a vertical direction (a direction Z in FIG. 1) so that the holding mechanism 30 can be moved between a position at which the plurality of substrates W held in the holding mechanism 30 are immersed into the treating liquid stored in the treating tank 20 (a position indicated by a solid line in FIG. 1, referred to as a "lower position") and a position at which the plurality of substrates W are lifted from the treating liquid (a position indicated by a broken line in FIG. 1, referred to as an "upper position").

In the upper space of the treating tank 20, the nozzle 53 and the nozzle 54 are disposed close to the opening part 20P.

The nozzle 53 is a hollow tubular member extending along the direction X, and has a plurality of outlets (not shown) formed at a predetermined interval in the direction X. Two nozzles 53 are disposed in parallel in the lateral direction (a direction Y) along an upper corner of the treating tank 20. Each nozzle 53 discharges IPA vapor from the plurality of outlets toward the opening part 20P of the treating tank 20, and forms an atmosphere containing the IPA vapor in the treating tank 20. Thick solid line arrows indicate directions in which a gas or a liquid is discharged from the nozzles.

To the nozzle 53, IPA vapor is supplied from the IPA supply source 73 at the outside of the chamber 10. The valve 63 is inserted into a pipeline between the nozzle 53 and the IPA supply source 73. By adjusting the opening of the valve 63, a quantity of the IPA vapor discharged from the nozzle 53 can be controlled.

The nozzle 54 is a hollow tubular member extending along the direction X, and has a plurality of outlets (not shown) formed at an equal interval in the direction X. Two nozzles 54 are disposed in parallel in the direction Y along an upper corner of the treating tank 20. The nozzle 54 discharges a hydrophobic agent from the plurality of outlets toward the opening part 20P of the treating tank 20, and can store a liquid-phase hydrophobic agent in the treating tank 20 and form in the treating tank 20 an atmosphere containing mist of the hydrophobic agent.

For the hydrophobic agent, there can be utilized silicon itself, and a silicon hydrophobic agent for hydrophobing containing a compound containing silicon, for example. The silicon hydrophobic agent is a silane coupling agent, for example. The silane coupling agent contains at least one of HMDS (hexamethyldisilazane), TMS (tetramethylsilane), fluorinated alkylchlorosilane, alkyldisilazane, and a non-chlorohydrophobic agent, for example. For example, the non-chlorohydrophobic agent contains at least one of dimethylsilyldimethylamine, dimethylsilyldiethylamine, hexamethyldisilazane, tetramethyldisilazane, bis(dinethilamino)dimethylsilane, N,N-dimethylaminotrimethlsilane, N-(trimethylsilyl)dimethylamine, and an organosilane compound. The hydrophobic agent may be metal itself or a metallic hydrophobic agent for hydrophobing a compound containing metal. For example, the metallic hydrophobic agent contains at least one of amine having a hydrophobic group, and an organic silicon compound.

The hydrophobic agent is used desirably in a state of being diluted with a solvent having a mutual dissolubility with a hydrophilic organic solvent such as IPA. In this case, it is desirable that the hydrophobic agent and the solvent having a mutual dissolubility with the hydrophilic organic solvent such as IPA are mixed immediately before the nozzle 54, and a mixture is supplied to the nozzle 54.

In the upper space of the treating tank 20, the nozzle 51 and the nozzle 52 are disposed at higher positions than the nozzle 53 and the nozzle 54.

To the nozzle 51, a nitrogen gas is supplied from the inert gas supply source 71 at the outside of the chamber 10. The nitrogen gas is desirably heated to the room temperature or above. The valve 61 is inserted into a pipeline between the nozzle 51 and the inert gas supply source 71. By adjusting the opening of the valve 61, a quantity of the nitrogen gas discharged from the nozzle 51 is controlled. The nozzle 51 is directed to the substrates W that are lifted to the upper position. By discharging the nitrogen gas from the nozzle 51, the internal space of the chamber 10 including the upper space of the treating tank 20 is filled with the nitrogen gas, and the substrates W located at the upper position are dried.

To the nozzle 52, the IPA vapor is supplied from the IPA supply source 72 at the outside of the chamber 10. The valve 62 is inserted into a pipeline between the nozzle 52 and the IPA supply source 72. By adjusting the opening of the valve 62, a quantity of the IPA vapor discharged from the nozzle 52 is controlled. The nozzle 52 is directed to the substrates W that are lifted to the upper position. By discharging the IPA vapor from the nozzle 52, the internal space of the chamber 10 including the upper space of the treating tank 20 is filled with the IPA vapor. On the surfaces of the substrates W located at the upper position, the hydrophobic agent that is in surplus can be replaced with the IPA vapor.

The valves 61 to 66, the lifting mechanism 40, and the supply sources 71 to 75 operate by the control of the control unit 80. The control unit 80 is realized by a computer that executes a program stored in the memory unit not shown. The memory unit holds in advance parameters that become a standard for the program to operate, such as a time for continuing each treatment.

The control unit 80 also controls the exhaust pump 90. The exhaust pump 90 is a vacuum pump, for example, and discharges a gas from the inside of the chamber 10 to the outside of the chamber 10.

(Treatment)

Figure 2:
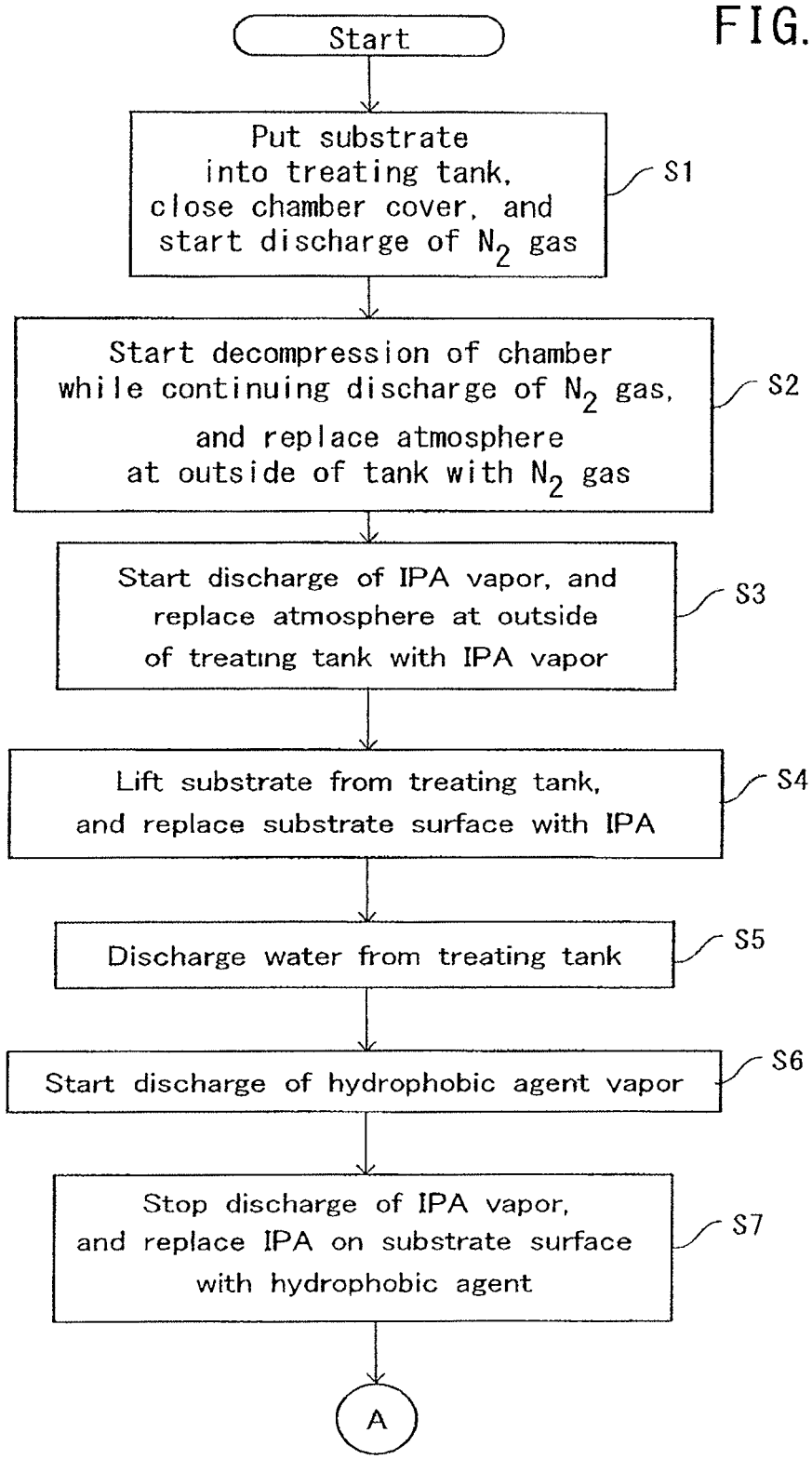
FIG. 2 is a treatment flowchart according to a first embodiment.
Figure 3:
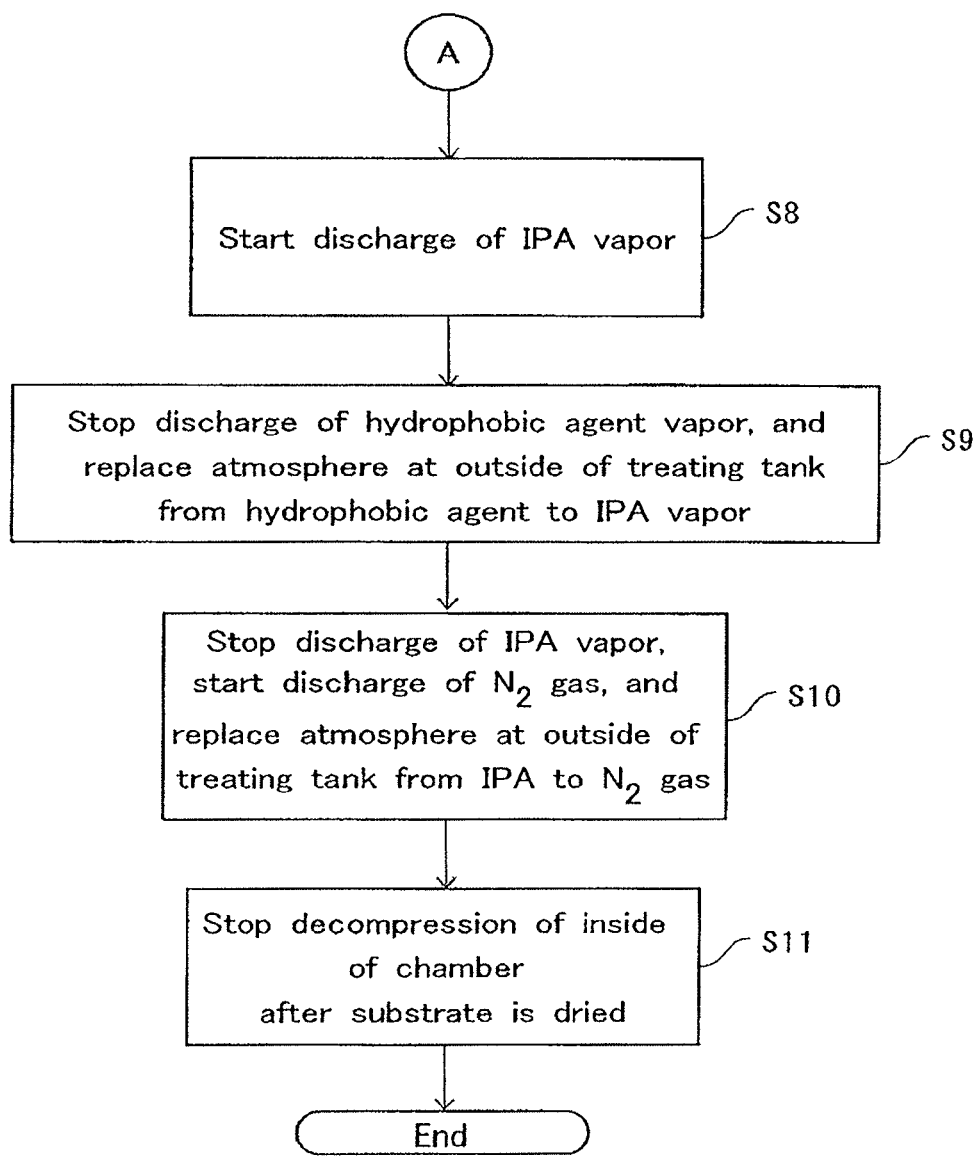
FIG. 3 is a treatment flowchart according to the first embodiment.
Figure 4:
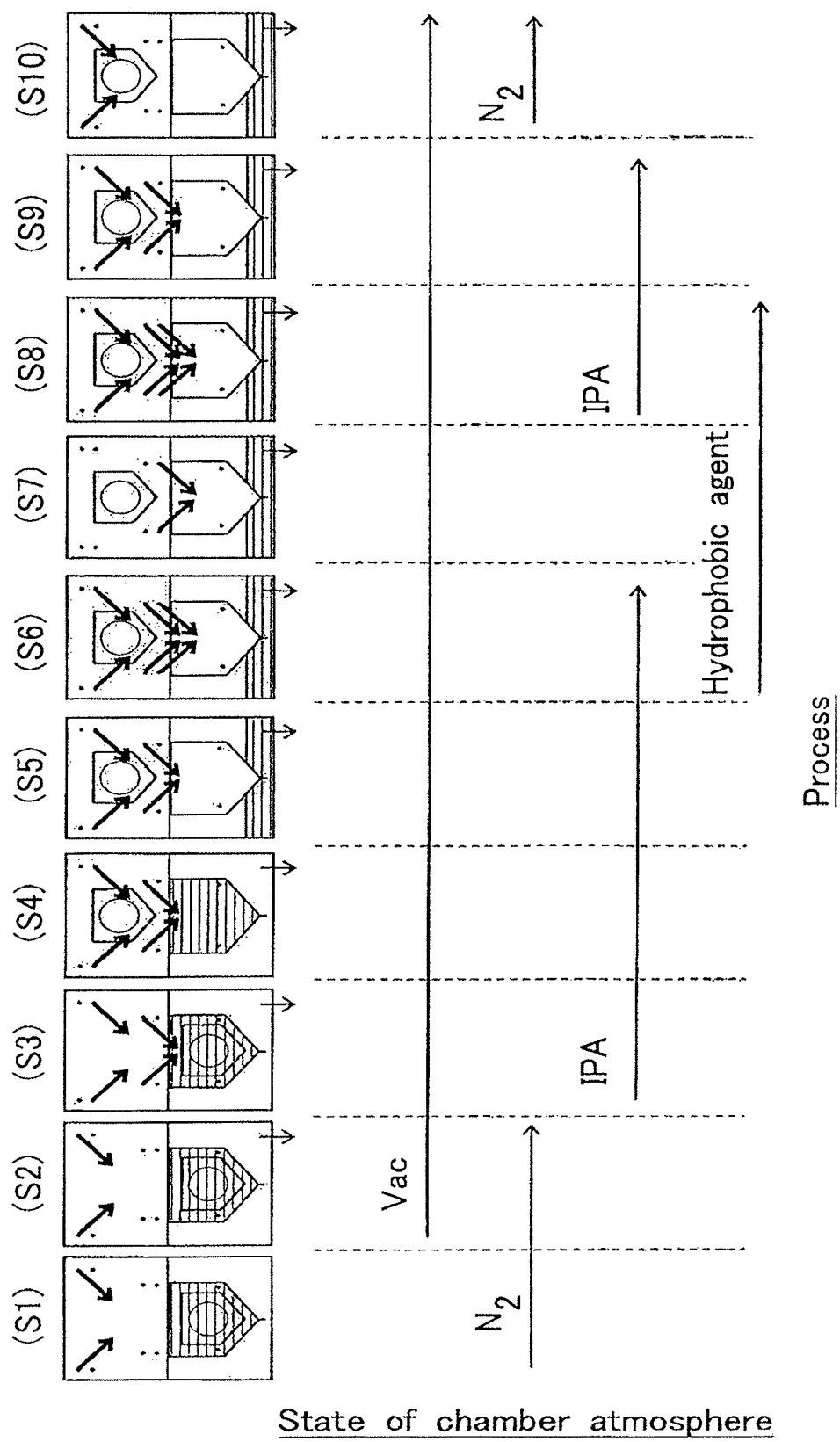
FIG. 4 is a diagram for describing the outline of a process sequence according to the first embodiment.

FIGS. 2 and 3 are treatment flowcharts according to the first embodiment. FIG. 4 is a diagram for describing the outline of a process sequence according to the first embodiment. In the treating unit not shown, the etching treatment and the washing treatment are performed to the substrates W. After the treatments, the substrates W are transferred to the substrate treating device 1.

The control unit 80 places the substrates W onto the holding mechanism 30, and moves the substrates W to the lower position in the treating tank 20 in which pure water supplied from the treating-liquid supply nozzle 55 is stored, for example. The control unit 80 seals the chamber 10 by closing the chamber cover 11 of the chamber 10. The control unit 80 opens the valve 61, and discharges the inert gas of the inert gas supply source 71 from the nozzle 51 (FIG. 2 and FIG. 4: S1). The inert gas is a nitrogen (N₂) gas, for example.

Next, the control unit 80 decompresses the inside of the chamber by operating the exhaust pump 90 while continuing the discharge of the inert gas (FIG. 2 and FIG. 4 S2 (Vac)). In the present step, replacement of the atmosphere outside the treating tank to the inert gas is completed.

Next, the control unit 80 opens the valve 62, and supplies the IPA vapor from the nozzle 52 to the upper space of the treating tank 20. Further, the control unit 80 opens the valve 63, and supplies the IPA vapor from the nozzle 53 toward the opening part 20P of the treating tank 20 (FIG. 2 and FIG. 4: S3). With this arrangement, the atmosphere of the IPA vapor is formed inside the chamber 10 surrounding the treating tank 20.

Next, the control unit 80 controls the lifting mechanism 40 while continuing the supply of the IPA vapor from the nozzle 52 and the nozzle 53, thus moving the holding mechanism 30 located at the lower position to the upper position at the upper part of the treating tank 20. During the period when the holding mechanism 30 is lifted from the lower position to the upper position, the substrates W held in the holding mechanism 30 are exposed to the IPA vapor supplied from the nozzle 52 and the nozzle 53. With this arrangement, the pure water adhering to the substrates W is replaced with IPA (FIG. 2 and FIG. 4: S4).

Further, the control unit 80 discharges the pure water in the treating tank 20, by opening the valve 66 (FIG. 2 and FIG. 4: S5). In the subsequent step, the hydrophobic agent supplied to the outside of the treating tank in the chamber 10 is deactivated by being reacted with water. Therefore, water is discharged from the treating tank 20 in advance in the present step.

Next, the control unit 80 starts supplying the hydrophobic agent vapor from the nozzle 54 by opening the valve 64, while continuing the discharge of the IPA vapor from the nozzle 52 and the nozzle 53 (FIG. 2 and FIG. 4: S6). In the present step, by continuing decompression, supply of the hydrophobic agent in the vapor state is facilitated. The control unit 80 that performs hydrophobing following a predetermined program corresponds to the "hydrophobing unit" according to the present invention.

The control unit 80 stops the discharge of the IPA vapor, and replaces the IPA on the substrate surface with the hydrophobic agent (FIG. 2 and FIG. 4: S7). In the present embodiment, by supplying the vapor of the hydrophobic agent, the IPA on the substrate surface can be replaced with the hydrophobic agent while reducing the use quantity of the hydrophobic agent. The hydrophobic agent has desirably a boiling point at or above the room temperature in order to condensate the hydrophobic agent on the surfaces of the substrates W. In the present step, the hydrophobic agent may be supplied in the state of vapor by heating the hydrophobic agent to the room temperature or above. However, an excessive increase in the temperature of the substrates W may dry the surfaces of the substrates W. Therefore, the substrates W are managed at a suitable temperature.

Next, the control unit 80 starts supplying the IPA vapor from the nozzles 52 and 53 by opening the valve 62 and the valve 63 (FIG. 3 and FIG. 4: S8).

Next, the control unit 80 controls the valve 64 while continuing the supply of the IPA vapor from the nozzle 52 and the nozzle 53, thus stopping the supply of the hydrophobic agent from the nozzle 54 (FIG. 3 and FIG. 4: S9). In the present step, the control unit 80 replaces the atmosphere at the outside of the treating tank from the hydrophobic agent to the IPA vapor, and replaces the hydrophobic agent on the substrate surface with the IPA.

Next, the control unit 80 closes the valve 62 and the valve 63, and opens the valve 61. With this arrangement, the inert gas is supplied from the nozzle 51 toward the substrates W located at the upper position, and the atmosphere at the outside of the treating tank is replaced from the IPA vapor to the inert gas (FIG. 3 and FIG. 4: S10). In the present step, the surfaces of the substrates W are dried.

Further, the control unit 80 stops the decompression after the substrates W are dried (FIG. 3 S11). In the present step, the supply of the inert gas is continued, and the internal pressure of the chamber 10 is increased to the atmospheric pressure.

(Effects)

As described above, in the present embodiment, by supplying the vapor of the hydrophobic agent, the IPA on the substrate surface can be replaced with the hydrophobic agent while reducing the use quantity of the hydrophobic agent. Specifically, although the hydrophobic agent of 10 l has been required to store the hydrophobic agent in the treating tank, the use quantity of the hydrophobic agent can be reduced to about 100 ml in the present embodiment. Further, when the substrate on which moisture is adhering is directly contacted to the hydrophobic agent, the reforming property is degraded and foreign matters occur in some cases. On the other hand, in the present embodiment, the IPA replacement is performed in S4 before starting the hydrophobing treatment in S7, and the moisture is removed from the surfaces of the substrates W. As described above, the hydrophobing treatment in S7 is performed on the substrates W from which the moisture has been removed. Therefore, at the hydrophobing treatment time, the hydrophobic agent and water are not in contact with each other, and deactivation of the hydrophobic agent and occurrence of foreign matters can be suppressed. Further, by continuing the decompression and the supply of the IPA in S6, collapse of the pattern formed on the substrate surface after the substrate surface is dried is prevented. If decompression is stopped, the IPA is rapidly vaporized when the decompression is started again, and there is a possibility that the substrate surface is dried and collapse of the pattern occurs. Further, when the surfaces of the substrates W are dried by leaving the hydrophobic agent on the surfaces of the substrates W, foreign matters remain on the substrate surface. Therefore, in 89, the hydrophobic agent on the substrate surface is replaced with the IPA again. At this time, the substrate surface has a hydrophobic property, and surface tension generated by the IPA between the patterns on the substrate surface is estimated to be reduced. Even when the substrate surface is finally dried, collapse of the pattern can be suppressed.

Second Embodiment

Figure 5:
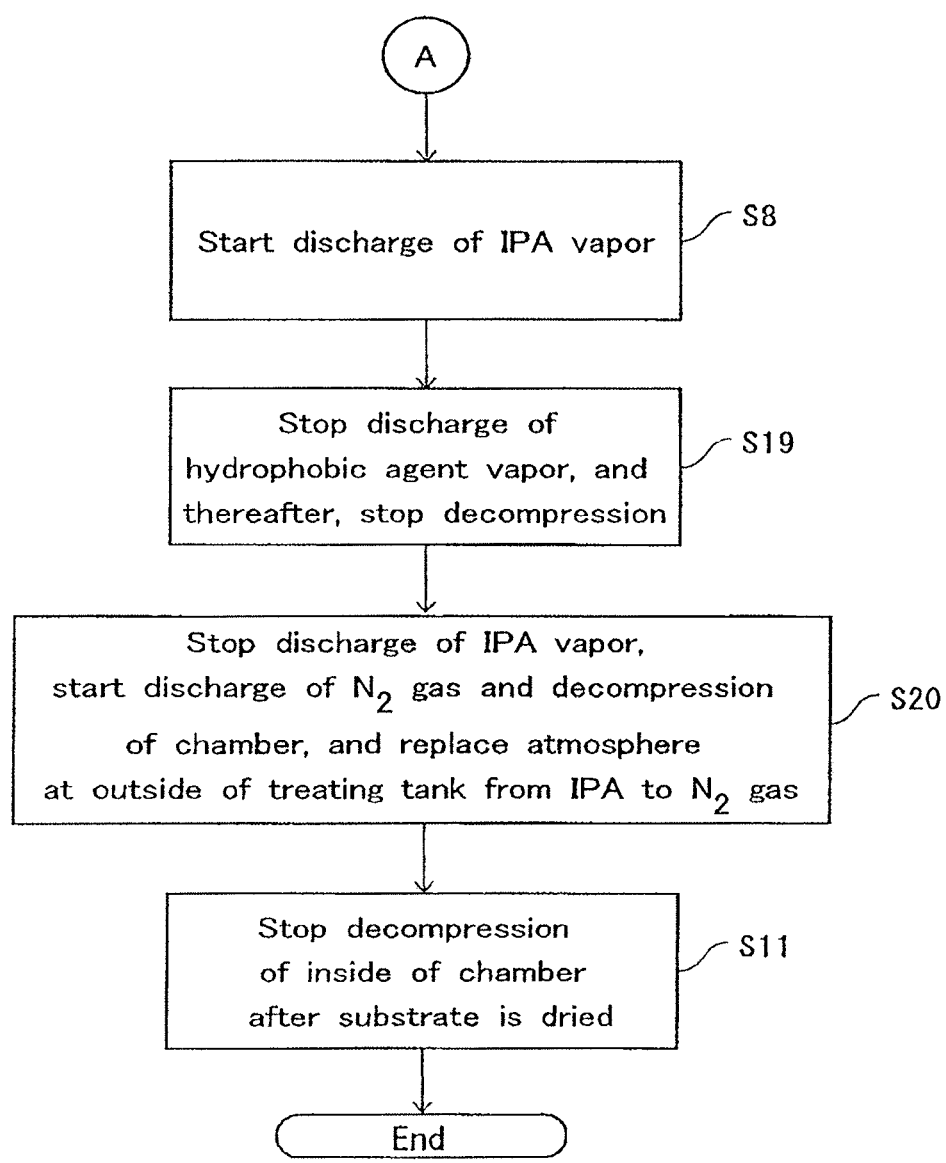
FIG. 5 is a treatment flowchart according to a second embodiment.
Figure 6:
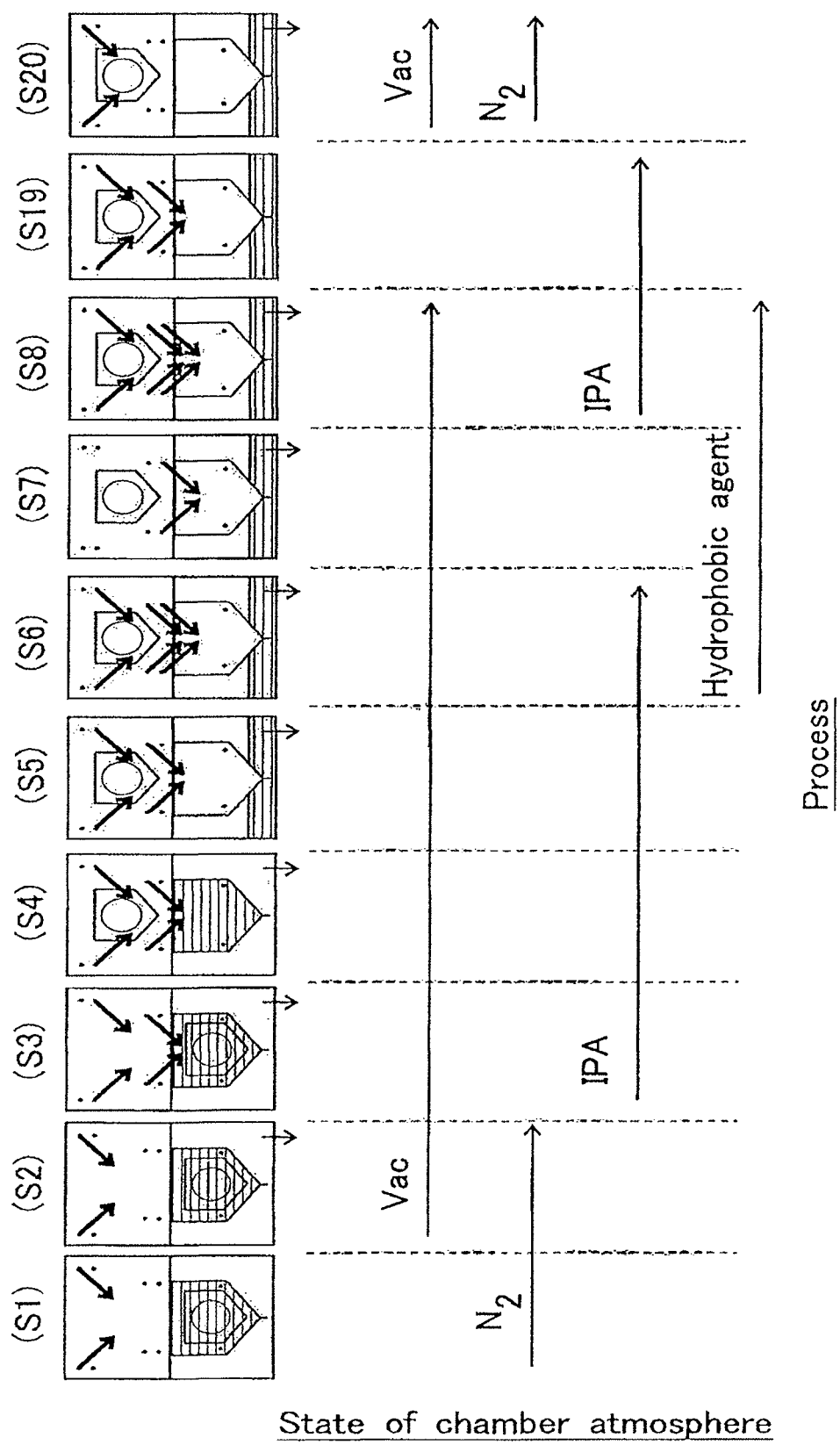
FIG. 6 is a diagram for describing the outline of a process sequence according to the second embodiment.

FIG. 5 is a treatment flowchart according to a second embodiment. FIG. 5 is a treatment flowchart of a latter half portion of the treatment flowchart which is different from the treatment flowchart according to the first embodiment. FIG. 6 is a diagram for describing the outline of a process sequence according to the second embodiment. Treatments which are the same as those in the first embodiment are attached with the same reference symbols as those in the first embodiment, and their description will be omitted.

In the present embodiment, after S8, the discharge of the hydrophobic agent is stopped. Thereafter, the decompression in the chamber 10 is temporarily stopped at an optional timing (FIG. 5 and FIG. 6: S19). With this arrangement, it is possible to increase the concentration of the IPA vapor of which supply is started in S8, and increase the IPA condensation quantity on the surface of the substrate W.

Thereafter, the control unit 80 stops supplying the IPA vapor, and starts decompressing the inside of the chamber 10 while starting the supply of the inert gas (FIG. 5 and FIG. 6: S20).

According to the present embodiment, condensation of the IPA vapor can be promoted by stopping the decompression in the chamber 10. Replacement efficiency of replacement from the hydrophobic agent on the surface of the substrate W to the IPA can be improved. By omitting the step of supplying in parallel the hydrophobic agent and the IPA, the treatment can be completed early.

<First Modification>

Figure 7:
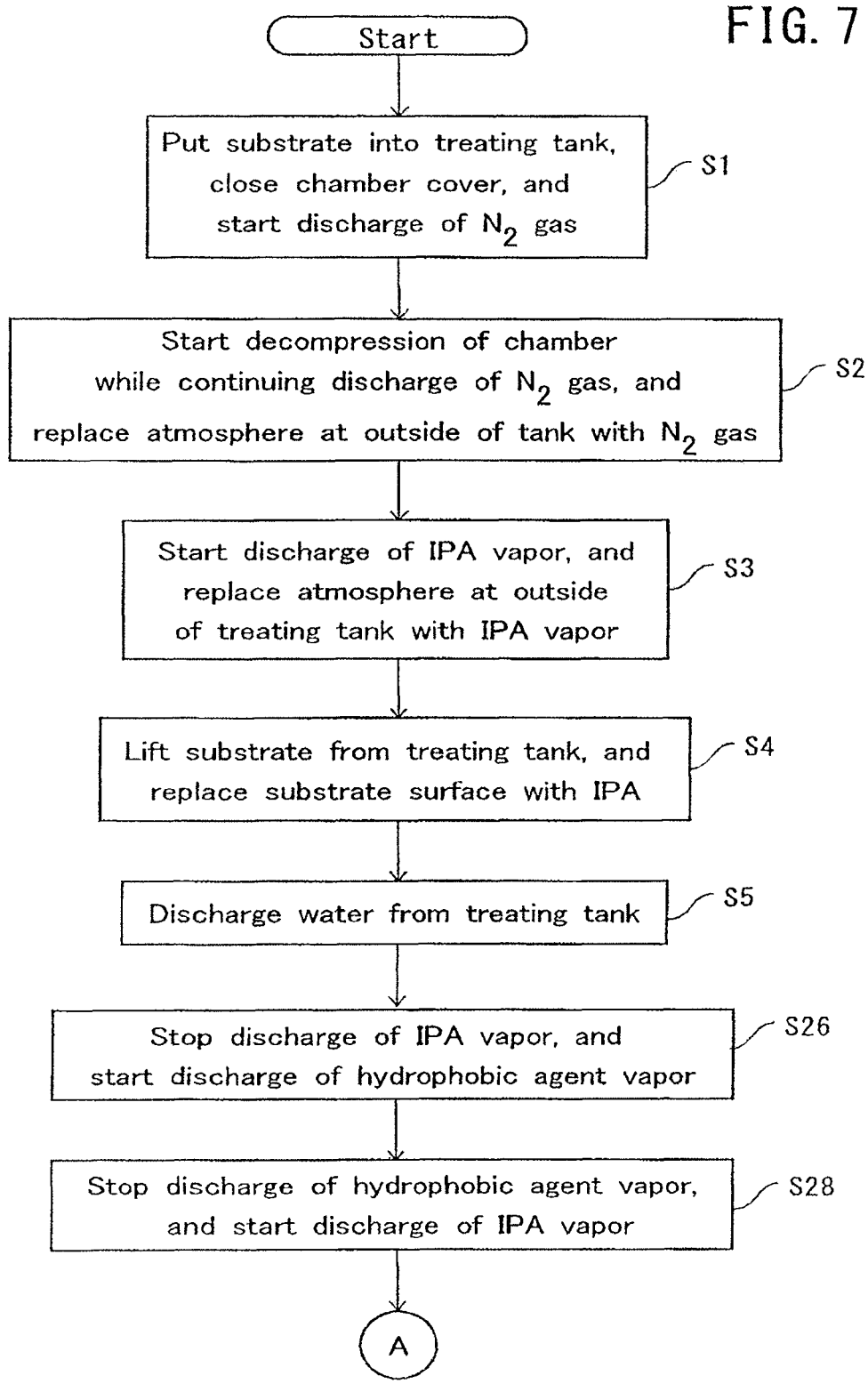
FIG. 7 is a treatment flowchart according to a first modification.
Figure 8:
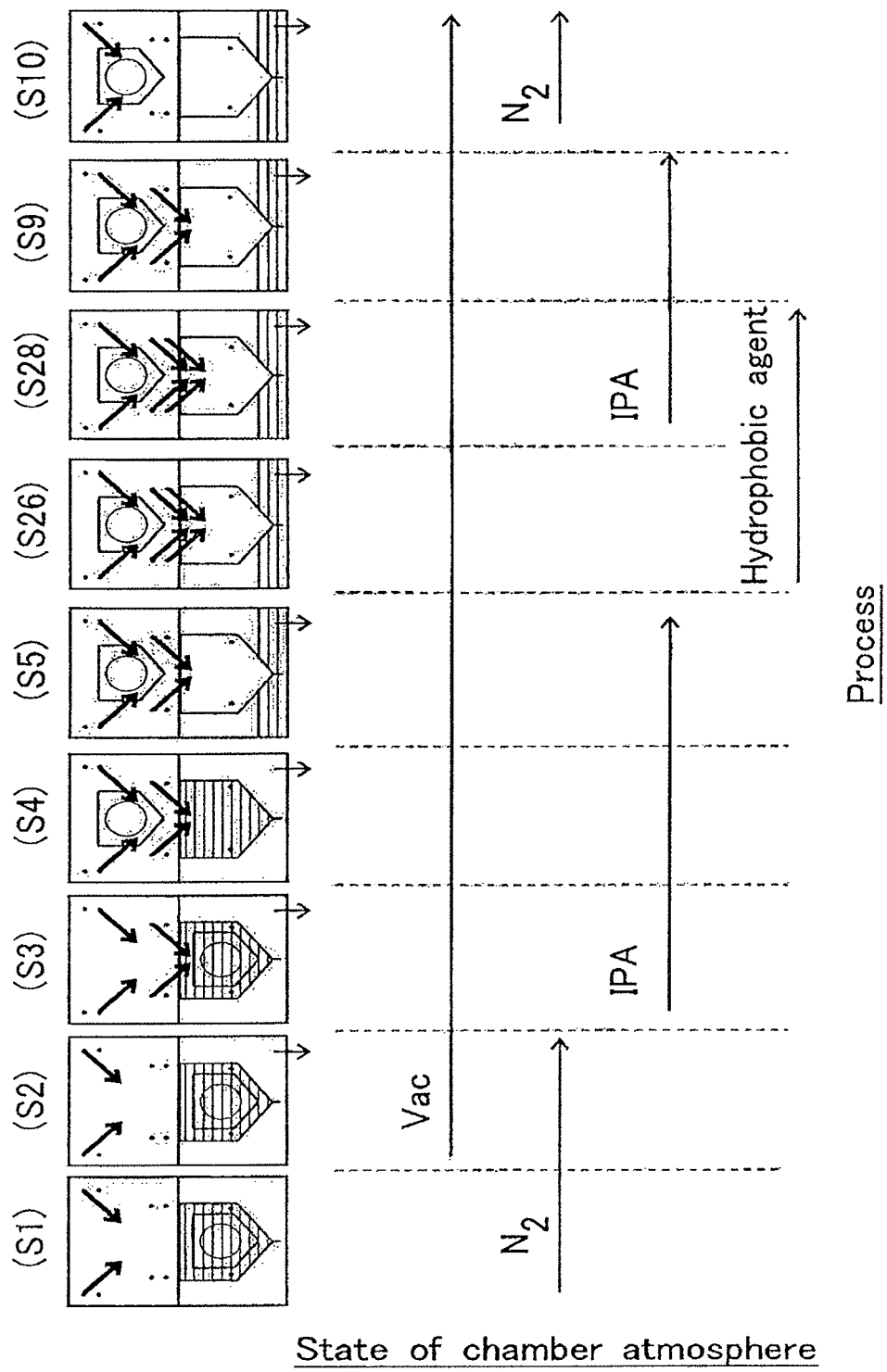
FIG. 8 is a diagram for describing the outline of a process sequence according to the first modification.

FIG. 7 is a treatment flowchart according to a first modification. FIG. 7 is a treatment flowchart of a first half portion of the treatment flowchart which is different from the treatment flowchart according to the first embodiment. FIG. 8 is a diagram for describing the outline of a process sequence according to the first modification.

In the present modification, after S5, the discharge of the IPA vapor is stopped, and the discharge of the hydrophobic agent vapor is started (FIG. 7 and FIG. 8: S26). In the present step, by switching between the discharge of the IPA vapor and the discharge of the hydrophobic agent vapor, the time required for replacing the IPA on the surface of the substrate W with the hydrophobic agent is shortened.

Thereafter, the discharge of the hydrophobic agent is stopped, and the discharge of the IPA vapor is started (FIG. 7 and FIG. 8: S28). In the present step, also by switching between the discharge of the hydrophobic agent vapor and the discharge of the IPA vapor, the time required for replacing the hydrophobic agent on the surface of the substrate W with the IPA is shortened. Thereafter, the treatment shifts to S9 in FIG. 3.

<Second Modification>

The hydrophobic agent for use may be a mixture of a plurality of kinds of agents. For example, an agent that functions as a hydrophobic agent (also referred to as a first agent) and an agent that functions as an activator (also referred to as a second agent) are mixed for use. In this case, in some agents that function as a hydrophobic agent and an activator, an effect of hydrophobing is enhanced in a predetermined time after mixing the agents and thereafter is lowered. In the case of using such agents, it is not desirable to mix the agents in advance.

In the present modification, two liquid reservoirs are provided in the chamber 10. The agents are mixed in the chamber 10. For example, the treating tank 20 is used for a first liquid reservoir. Further, for example, a second liquid reservoir is provided around the treating tank 20. Then, the two liquids are supplied in a liquid state into the chamber 10, and are vaporized and mixed in the chamber 10. A shielding member that partitions the inside of the chamber 10 may be provided in the height of the vicinity of the upper end of the treating tank 20. The liquid reservoir may be provided on a higher position side than the shielding member. With this configuration, agents and the like stored in the liquid reservoir can be efficiently vaporized around the substrate.

With this arrangement, the efficiency and effect of hydrophobing can be improved.

<Third Modification>

In the embodiments or the modifications, at least a part of the supplied hydrophobic agent may be in the state of liquid instead of vapor. That is, in S6 in FIG. 2 and FIG. 4, S6 in FIG. 6, and S26 in FIG. 7 and FIG. 8, at least a part of the discharged hydrophobic agent is supplied in the state of liquid. At this time, the atmospheric pressure in the chamber 10 is decompressed in advance to a pressure not more than a pressure at which the hydrophobic agent is vaporized, in a similar manner to that in the other embodiments and modifications. The hydrophobic agent may be supplied to the treating tank 20 (the first liquid reservoir), for example, or may be supplied to the second liquid reservoir as described in the second modification. The substrate treating device may be configured to include any one of the liquid reservoirs. In the case of supplying the hydrophobic agent to the treating tank 20, the concentration of the hydrophobic agent after vaporization becomes higher in the lower treating tank 20 out of the concentration in the chamber 10. Therefore, by moving the substrates W to the lower position, the replacement efficiency of replacement from the IPA to the hydrophobic agent may be improved.

With this arrangement, the hydrophobic agent supplied in liquid can be vaporized in the chamber 10. The surface of the substrate W can be hydrophobed while suppressing the use quantity of the hydrophobic agent, in a similar manner to the case of supplying the hydrophobic agent in gas. The path from the hydrophobic agent supply source 74 to the nozzle 54 is not decompressed. Therefore, in order to vaporize the hydrophobic agent to be discharged to the chamber 10, the temperature of the hydrophobic agent needs to be increased in advance. According to the present modification, the cost for heating the hydrophobic agent can be also reduced. When the temperature of the substrate W exposed to the atmosphere of the hydrophobic agent is excessively increased, the surface of the substrate W is dried in the state of insufficient replacement to the IPA in the replacement from the hydrophobic agent to the IPA. This may lead to collapse of a pattern. According to the present modification, the temperature of the hydrophobic agent is not excessively increased, and collapse of the pattern can be suppressed.

<Others>

The contents described in the embodiments and the modifications can be performed by combining together to an achievable extent.

What is claimed is:

1. A substrate treating method for drying a substrate on a surface of which a predetermined pattern is formed, the substrate treating method comprising:
   a washing step of washing the substrate by immersing the substrate into a washing liquid after the washing liquid is stored into the treating tank in a sealed chamber;
   a decompression step of decompressing an inside of the chamber after the washing step;
   a lifting step of lifting the substrate from the washing liquid stored in the treating tank in the decompression step;
   a liquid discharge step of discharging the washing liquid from the treating tank in the decompression step and after the lifting step; and
   a hydrophobing step of replacing an atmosphere in the chamber with a hydrophobic agent and performing a hydrophobing treatment on the surface of the substrate in the decompression step and after the liquid discharge step.

2. The substrate treating method according to claim 1, further comprising a first organic-solvent-atmosphere forming step of replacing the atmosphere in the chamber with an organic solvent after the washing step and before the decompression step.

3. The substrate treating method according to claim 1, further comprising a second organic-solvent-atmosphere forming step of replacing the atmosphere in the chamber with an organic solvent after the hydrophobing step.

4. The substrate treating method according to claim 3, wherein the second organic-solvent-atmosphere forming step is performed while the treatment of decompressing the inside of the chamber which is started in the decompression step is continued.

5. The substrate treating method according to claim 3, wherein the second organic-solvent-atmosphere forming step is performed after the decompression of the inside of the chamber which is started in the decompression step is stopped.

6. The substrate treating method according to claim 1, wherein in the hydrophobing step, at least a part of the hydrophobic agent is supplied as liquid to the treating tank.

7. The substrate treating method according to claim 1, further comprising a liquid reservoir capable of storing a liquid,
wherein in the hydrophobing step, at least a part of the hydrophobic agent is supplied in liquid to the liquid reservoir.

8. The substrate treating method according to claim 7, wherein
the hydrophobic agent functions by mixing a first agent and a second agent, and
in the hydrophobing step, the first agent is supplied to the treating tank and the second agent is supplied to the liquid reservoir.

9. The substrate treating method according to claim 7, wherein
the chamber has a shielding member that partitions a space inside the chamber, and
the liquid reservoir is provided on a same side as a substrate after the substrate is lifted higher than the shielding member in the lifting step.

10. A substrate treating device that dries a substrate on a surface of which a predetermined pattern is formed, the substrate treating device comprising:
a sealed chamber;
a treating tank provided in the chamber and capable of washing the substrate by storing a washing liquid;
a decompressing unit that decompresses an inside of the chamber after the washing of the substrate;
a lifting unit that lifts the substrate from the washing liquid in the treating tank in a decompressing by the decompressing unit;
a liquid discharge unit that discharges a washing liquid from the treating tank in the decompressing by the decompressing unit and after the lifting by the lifting unit; and
a hydrophobing unit that replaces an atmosphere in the chamber with a hydrophobic agent after the liquid discharge unit discharges the washing liquid in the decompressing by the decompressing unit and after a discharging by the liquid discharge unit.

11. A substrate treating method for drying a substrate on a surface of which a predetermined pattern is formed, the substrate treating method comprising:
a washing step of washing the substrate by immersing the substrate into a washing liquid after the washing liquid is stored into the treating tank in a sealed chamber;
a decompression step of decompressing an inside of the chamber after the washing step;
a first organic-solvent-atmosphere forming step of supplying an organic solvent in order to replace the atmosphere in the chamber with an organic solvent in the decompression step;
a lifting step of lifting the substrate to the atmosphere in the chamber from the washing liquid stored in the treating tank in the first organic-solvent-atmosphere forming step;
a liquid discharge step of discharging the washing liquid from the treating tank in the first organic-solvent-atmosphere forming step and after the lifting step;
a hydrophobing step of replacing an atmosphere in the chamber with a hydrophobic agent and performing a hydrophobing treatment on the surface of the substrate in the decompression step and after the liquid discharge step; and
a second organic-solvent-atmosphere forming step of replacing the atmosphere in the chamber with the organic solvent after the hydrophobing step.

12. The substrate treating method according to claim 11, wherein in the hydrophobing step, a supplying of the hydrophobic agent is started in a period overlapped with the first organic-solvent-atmosphere forming step and the hydrophobing treatment is performed after the first organic-solvent-atmosphere forming step.

13. The substrate treating method according to claim 11, wherein in the second organic-solvent-atmosphere forming step, a supplying of the organic solvent is started in a period overlapped with the hydrophobing step.

14. A substrate treating device that dries a substrate on a surface of which a predetermined pattern is formed, the substrate treating device comprising:
a sealed chamber;
a treating tank provided in the chamber and capable of washing the substrate by storing a washing liquid;
a decompressing unit that decompresses an inside of the chamber after the washing of the substrate;
an organic solvent supplying unit that performs a first organic-solvent-atmosphere forming step of replacing the atmosphere in the chamber with an organic solvent after the washing of the substrate and in a decompression by the decompressing unit;
a lifting unit that lifts the substrate to the atmosphere in the chamber from the washing liquid in the treating tank in the first organic-solvent-atmosphere forming step;
a liquid discharge unit that discharges a washing liquid from the treating tank in the first organic-solvent-atmosphere forming step and after the lifting by the lifting unit; and
a hydrophobing unit that replaces an atmosphere in the chamber with a hydrophobic agent and performing a hydrophobing treatment on the surface of the substrate in the decompression by the decompressing unit and a discharging by the liquid discharge unit;
wherein the organic solvent supplying unit performs a second organic-solvent-atmosphere forming step of replacing the atmosphere in the chamber with an organic solvent after the hydrophobing treatment.

15. The substrate treating device according to claim 14, wherein the hydrophobing unit starts a supplying of the hydrophobic agent in a period overlapped with the first organic-solvent-atmosphere forming step and the hydrophobing treatment is performed after the first organic-solvent-atmosphere forming step.

16. The substrate treating device according to claim 14, wherein the organic solvent supplying unit starts a supplying of the organic solvent in a period overlapped with the hydrophobing treatment and replaces the atmosphere in the chamber with the organic solvent after the hydrophobing treatment.

\* \* \* \* \*